(12) United States Patent
Park et al.

(10) Patent No.: US 8,963,654 B2
(45) Date of Patent: Feb. 24, 2015

(54) DUAL INPUT, DUAL OUTPUT BAWR FILTERING APPARATUS INCLUDING A LADDER-BRIDGE-LADDER CONFIGURATION

(75) Inventors: Yun Kwon Park, Dongducheon-si (KR); In Sang Song, Hwaseong-si (KR); Duck Hwan Kim, Goyang-si (KR); Chul Soo Kim, Hwaseong-si (KR); Jea Shik Shin, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 760 days.

(21) Appl. No.: 12/837,630

(22) Filed: Jul. 16, 2010

(65) Prior Publication Data
US 2011/0032053 A1 Feb. 10, 2011

(30) Foreign Application Priority Data
Aug. 4, 2009 (KR) .................. 10-2009-0071674

(51) Int. Cl.
*H03H 9/58* (2006.01)
*H03H 9/00* (2006.01)
*H03H 9/60* (2006.01)
*H03H 9/17* (2006.01)

(52) U.S. Cl.
CPC .......... *H03H 9/0095* (2013.01); *H03H 9/0023* (2013.01); *H03H 9/605* (2013.01); *H03H 9/173* (2013.01)

USPC .......................................... 333/189; 333/190

(58) Field of Classification Search
CPC ... H03H 9/0023; H03H 9/0095; H03H 9/605; H03H 9/703
USPC ........................................... 333/189, 190, 25
See application file for complete search history.

(56) References Cited

U.S. PATENT DOCUMENTS

| 6,542,055 B1 * | 4/2003 | Frank et al. .................... 333/189 |
| 6,870,446 B2 * | 3/2005 | Ohara et al. ................... 333/188 |
| 7,194,247 B2 | 3/2007 | Tikka et al. |
| 7,212,085 B2 | 5/2007 | Wu |
| 2004/0113720 A1 * | 6/2004 | Komuro et al. ............... 333/133 |
| 2005/0068125 A1 | 3/2005 | Unterberger et al. |
| 2008/0272853 A1 * | 11/2008 | Heinze et al. .................. 333/129 |

FOREIGN PATENT DOCUMENTS

| EP | 1 202 454 | 5/2002 |
| KR | 10-2003-0076977 | 9/2003 |
| WO | WO 03/098802 | 11/2003 |
| WO | WO 2004/066494 | 8/2004 |
| WO | WO 2006/018788 | 2/2006 |

* cited by examiner

*Primary Examiner* — Benny Lee
(74) *Attorney, Agent, or Firm* — NSIP Law

(57) ABSTRACT

A Dual Input, Dual Output filtering apparatus using a Bulk Acoustic Wave Resonators (BAWR), and a resonator used as the BAWR may be provided. A Dual Input, Dual Output filtering apparatus may include a plurality of BAWRs connected in series and parallel.

8 Claims, 11 Drawing Sheets

DUAL INPUT, DUAL OUTPUT BAWR FILTERING APPARATUS INCLUDING A LADDER-BRIDGE-LADDER CONFIGURATION

CROSS-REFERENCE TO RELATED APPLICATION(S)

This application claims the benefit under 35 U.S.C. §119 (a) of Korean Patent Application No. 10-2009-0071674, filed Aug. 4, 2009, in the Korean Intellectual Property Office, the entire disclosure of which is incorporated herein by reference for all purposes.

BACKGROUND

1. Field

The following description relates to a filtering apparatus, and more particularly to a Dual Input, Dual Output filtering apparatus using a Bulk Acoustic Wave Resonator (BAWR) and a resonator which may be used as the BAWR.

2. Description of the Related Art

An analog Radio Frequency (RF) region may indicate an area from an end of an antenna to an end of a mixer in a mobile communication. To use frequencies of various bands in an analog RF region, the number of passive components such as an antenna, a filter, a duplexer, a matching circuit, and the like may proportionally increase, and a requirement for an area and a characteristic of the passive components may also proportionally increase.

SUMMARY OF THE INVENTION

In one general aspect, there is provided a filtering apparatus, including a plurality of Bulk Acoustic Wave Resonators (BAWRs) configured to be connected in series and in parallel. Two input ends of the plurality of BAWRs, connected in series, are for Dual Input, and two output ends of the plurality of BAWRs connected in series are for Dual Output.

Resonant frequencies of the plurality of BAWRs connected in series may be different from resonant frequencies of the plurality of BAWRs connected in parallel.

The filtering apparatus may further include at least one ladder, and a portion of the plurality of BAWRs may include at least a first BAWR, a second BAWR and a third BAWR. The at least one ladder may include the first BAWR and the second BAWR configured to be connected in series and the third BAWR configured to have an end connected to an input end of the first BAWR, and another end connected to an input end of the second BAWR.

The filtering apparatus may further include at least one ladder, and a portion of the plurality of BAWRs may include at least a first BAWR, a second BAWR and a third BAWR. The at least one ladder may include the first BAWR and the second BAWR configured to be connected in series and the third BAWR configured to have an end connected to an output end of the first BAWR, and another end connected to an output end of the second BAWR.

The filtering apparatus may further include at least one ladder, and a portion of the plurality of BAWRs may include at least a first BAWR, a second BAWR, and a third BAWR. The at least one ladder may include the first BAWR and the second BAWR configured to be connected in series and the third BAWR configured to have an end connected to an input end of the first BAWR, and another end connected to an input end of the second BAWR.

The filtering apparatus may further include at least one ladder, and a portion of the plurality of BAWRs may include at least a first BAWR and a second BAWR. The at least one ladder may comprise the first BAWR and the second BAWR configured to be connected in series and a plurality of additional BAWRs configured to be connected in parallel.

The plurality of additional BAWRs connected in parallel is divided into two rows, an end of each adjacent BAWR is connected to each other, another end of a first-located BAWR of each of the two rows is connected to an output end of the first BAWR, and another end of a last-located BAWR of each of the two rows is connected to an output of the second BAWR.

The filtering apparatus may further comprise at least one ladder, and a portion of the plurality of BAWRs may include at least a first BAWR, a second BAWR, a third BAWR and a fourth BAWR. The at least one ladder may include the first BAWR and the second BAWR configured to be connected in series, an end of each of the first BAWR and the second BAWR being connected to each other, the third BAWR and the fourth BAWR configured to be connected in series, an end of each of the third BAWR and the fourth BAWR being connected to each other, and a plurality of additional BAWRs configured to be connected in parallel.

The plurality of additional BAWRs connected in parallel may be divided into two rows, an end of each adjacent BAWR connected in parallel is connected to each other, another end of a first-located BAWR of each of the two rows is connected to an output end of each of the first BAWR and the second BAWR, and another end of a last-located BAWR of each of the two rows is connected to an output of each of the third BAWR and the fourth BAWR.

The filtering apparatus may further comprise at least one bridge and at least one ladder, wherein at least two BAWRs are connected in series in the bridge and at least two BAWRs are connected in series in the ladder, and an end of each of two BAWRs is connected to an end of each of two BAWRs of the BAWRs connected in series in the at least one ladder.

The at least one bridge and the at least one ladder may be configured to enable a signal to be inputted in an order from a bridge to a ladder.

The at least one bridge and the at least one ladder may be configured to enable a signal to be inputted in an order from a ladder to a bridge.

The at least one bridge and the at least one ladder may be configured to enable a signal to be inputted in an order from a ladder, a bridge, and a ladder.

The at least one bridge and the at least one ladder may be configured to enable a signal to be inputted in an order from a bridge, a ladder, and a bridge.

Each of the plurality of BAWRs may comprise an air gap to be formed on a Low Temperature Oxide (LTO) located on silicon, or formed on silicon located on a first metal electrode, a support to be formed on the air gap using a dielectric substance, a second metal electrode to be formed on the support, a piezoelectric material to be formed on the second metal electrode, a third metal electrode to be formed on the piezoelectric material, and a dielectric substance to be formed on the third metal electrode.

In another aspect there is provided a resonator comprising an air gap formed on an LTO located on silicon, or formed on silicon located on a first metal electrode, a support formed on the air gap using a dielectric substance, a second metal electrode formed on the support, a piezoelectric material formed on the second metal electrode, a third metal electrode formed on the piezoelectric material, and a dielectric substance formed on the third metal electrode.

The support may be formed using any one of the LTO and Silicon Nitride as the dielectric substance.

The second metal electrode may be formed using Molybdenum (Mo).

The piezoelectric material may be formed using Aluminum Nitride (AlN).

The third metal electrode may be formed using ruthenium (Ru).

The dielectric substance formed on the third metal electrode may be formed using the LTO.

Other features and aspects may be apparent from the following detailed description, the drawings, and the claims.

Figure 1:
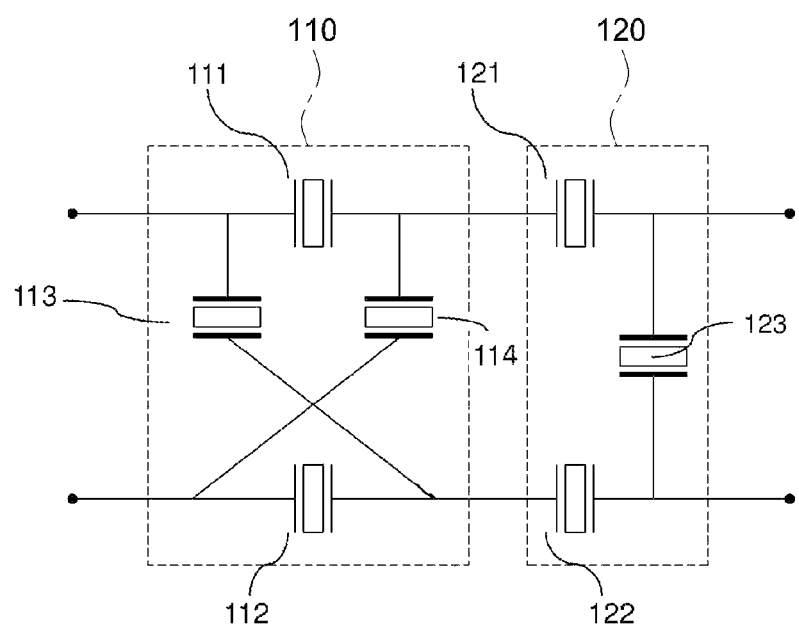
FIG. 1 is a diagram illustrating an example of a filtering apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION OF THE INVENTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

According to an example of an embodiment, a filtering apparatus includes a plurality of Bulk Acoustic Wave Resonators (BAWRs) which are connected in series and in parallel. In this example, two input ends and two output ends from among input ends and output ends of the plurality of BAWRs, connected in series, are used for dual input and dual output, respectively. A portion of the plurality of BAWRs may include at least one bridge, and remaining BAWRs may include at least one ladder. Also, a BAWR connected in series and a BAWR connected in parallel may have different resonant frequencies.

FIG. 1 illustrates a configuration of one example of a filtering apparatus. The filtering apparatus includes a bridge 110 and a first ladder 120. In this example, the bridge 110 includes a first BAWR 111, a second BAWR 112, a third BAWR 113, and a fourth BAWR 114. The first BAWR 111 and the second BAWR 112 are connected in series. The third BAWR 113 has an end connected to an input end of the first BAWR 111, and another end connected to an output end of the second BAWR 112. The fourth BAWR 114 has an end connected to an output end of the first BAWR 111, and another end connected to an input end of the second BAWR 112.

The first ladder 120 includes a fifth BAWR 121, a sixth BAWR 122, and a seventh BAWR 123. The fifth BAWR 121 and the sixth BAWR 122 are connected in series. The seventh BAWR 123 has an end connected to an output end of the fifth BAWR 121, and another end connected to an output end of the sixth BAWR 122. Here, the input end of the first BAWR and the input end of the second BAWR are an input end for dual input. The output end of the fifth BAWR and the output end of the sixth BAWR are an output end for dual output. That is, in this example, the bridge 110 and the first ladder 120 are configured to enable a signal to be inputted in an order from a bridge to a ladder. In this instance, the bridge 110 and the first ladder 120 may be configured to connect the output end of each of the first BAWR 111 and the second BAWR 112 to the input end of each of the fifth BAWR 121 and the sixth BAWR 122.

Figure 2:
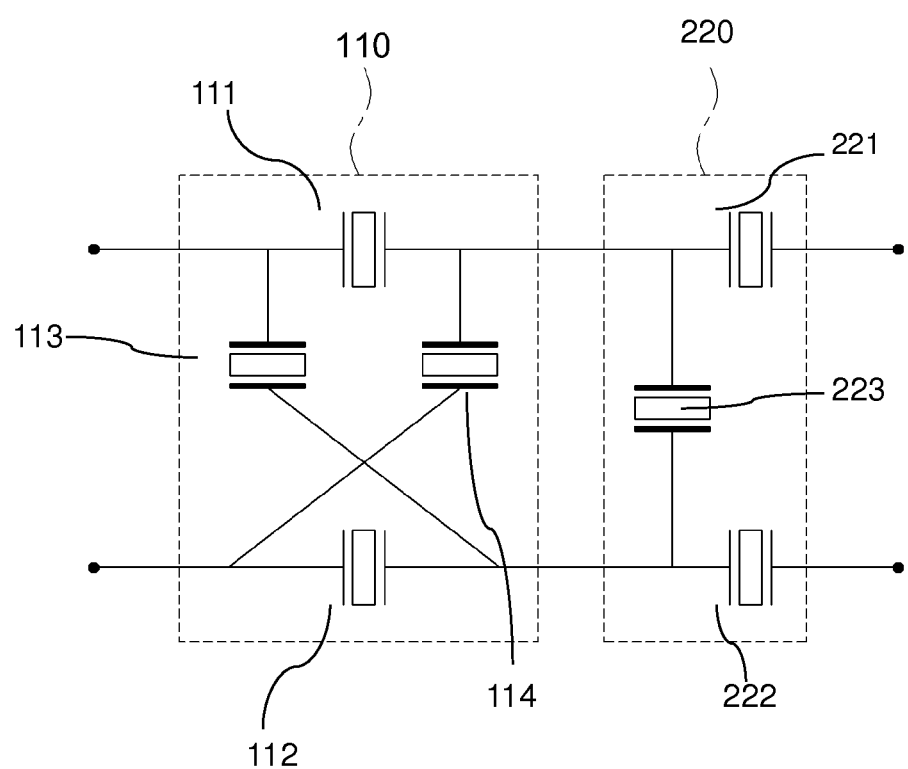
FIG. 2 is a diagram illustrating another example of a filtering apparatus.

FIG. 2 illustrates a configuration of another example of a filtering apparatus. The filtering apparatus may include the bridge 110 and a second ladder 220. In this example, the bridge 110 includes the first BAWR 111, the second BAWR 112, the third BAWR 113, and the fourth BAWR 114. The first BAWR 111 and the second BAWR 112 are connected in series. The third BAWR 113 has an end connected to an input end of the first BAWR 111, and another end connected to an output end of the second BAWR 112. The fourth BAWR has an end connected to an output end of the first BAWR 111, and another end connected to an input end of the second BAWR 112. Also, the second ladder 220 further includes an eighth BAWR 221, a ninth BAWR 222, and a tenth BAWR 223. The eighth BAWR 221 and the ninth BAWR 222 are connected in series. The tenth BAWR 223 has an end connected to an input end of the eighth BAWR 221, and another end connected to an input end of the ninth BAWR 222. In this example, the input end of the first BAWR 111 and the input end of the second BAWR 112 are an input end for dual input. An output end of the eighth BAWR 221 and an output end of the ninth BAWR 222 are an output end for dual output. That is, the bridge 110 and the second ladder 220 are configured to enable a signal to be inputted in an order from a bridge to a ladder. In this instance, the bridge 110 and the second ladder 220 may be configured to connect the output end of each of the first BAWR 111 and the second BAWR 112 to the input end of each of the eighth BAWR 221 and the ninth BAWR 222.

Figure 3:
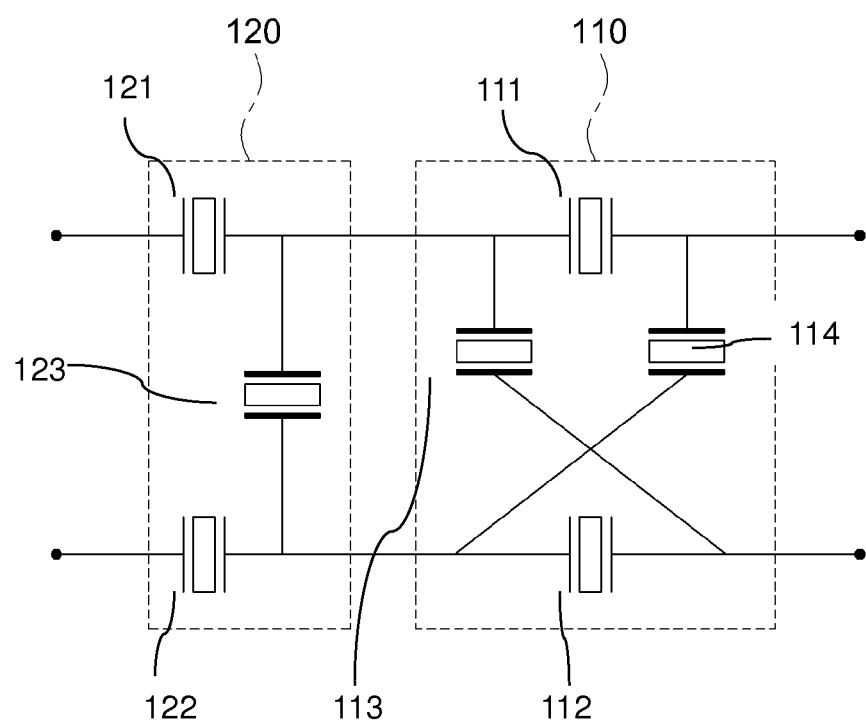
FIG. 3 is a diagram illustrating still another example of a filtering apparatus.

FIG. 3 illustrates a configuration of still another example of a filtering apparatus. The filtering apparatus may include the bridge 110 and the first ladder 120. In this example, a connection order of the bridge 110 and first ladder 120 in the filtering apparatus is different than the previous examples. By way of example, as illustrated in FIG. 3, the bridge 110 and the first ladder 120 are configured to enable a signal to be inputted in an order from the ladder 120 to the bridge 110. In this example, input ends of two BAWRs 121, 122 included in the first ladder 120 are an input end for dual input. Output ends of two BAWRs 111, 112 included in the bridge 110 are an output end for dual output. Here, the two BAWRs included in each of the first ladder 120 and the bridge 110 may be connected in series.

Figure 4:
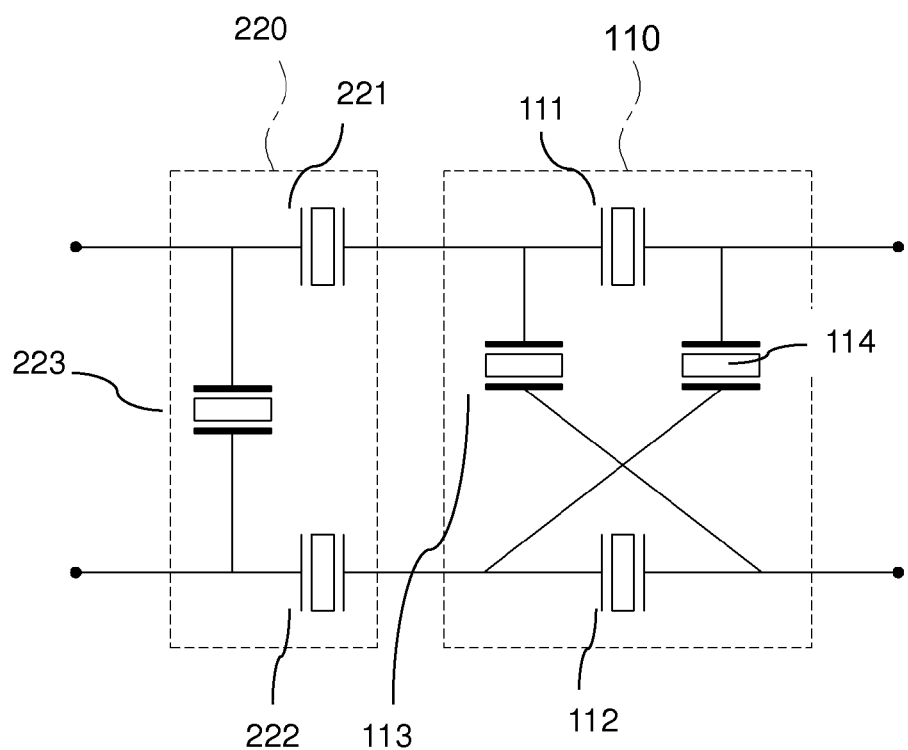
FIG. 4 is a diagram illustrating yet another example of a filtering apparatus.

FIG. 4 illustrates a configuration of yet another example of a filtering apparatus. The filtering apparatus includes the bridge 110 and the second ladder 220. In this example, a connection order of the bridge 110 and second ladder 220 of the filtering apparatus is different than the previous examples. By way of example, as illustrated in FIG. 4, the bridge 110 and the second ladder 220 are configured to enable a signal to be inputted in an order from the ladder 220 to the bridge 110. In this instance, input ends of two BAWRs 221, 222 included in the second ladder 220 are an input end for dual input, and output ends of two BAWRs 111, 112 included in the bridge 110 are an output end for dual output. Here, the two BAWRs included in each of the second ladder 220 and the bridge 110 may be connected in series.

Figure 5:
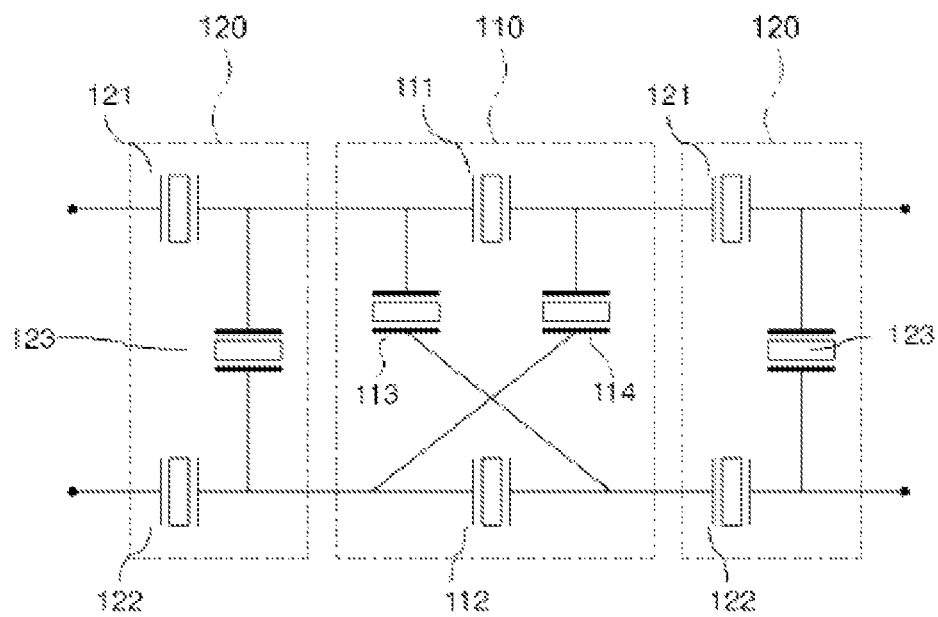
FIG. 5 is a diagram illustrating a further example of a filtering apparatus.

FIG. 5 illustrates a configuration of a further example of a filtering apparatus. The filtering apparatus includes the bridge 110 and two first ladders 120. In this example, the bridge 110 and the two first ladders 120 are configured to enable a signal to be inputted in an order from a first ladder, a bridge, to the other first ladder. In this instance, input ends of two BAWRs 121, 122 included in one of the first ladders 120 are an input end for dual input, and output ends of two BAWRs 121, 122 included in the other first ladder 120 are an output end for dual output. Here, the two BAWRs included in each of the two first ladders 120 may be connected in series.

Figure 6:
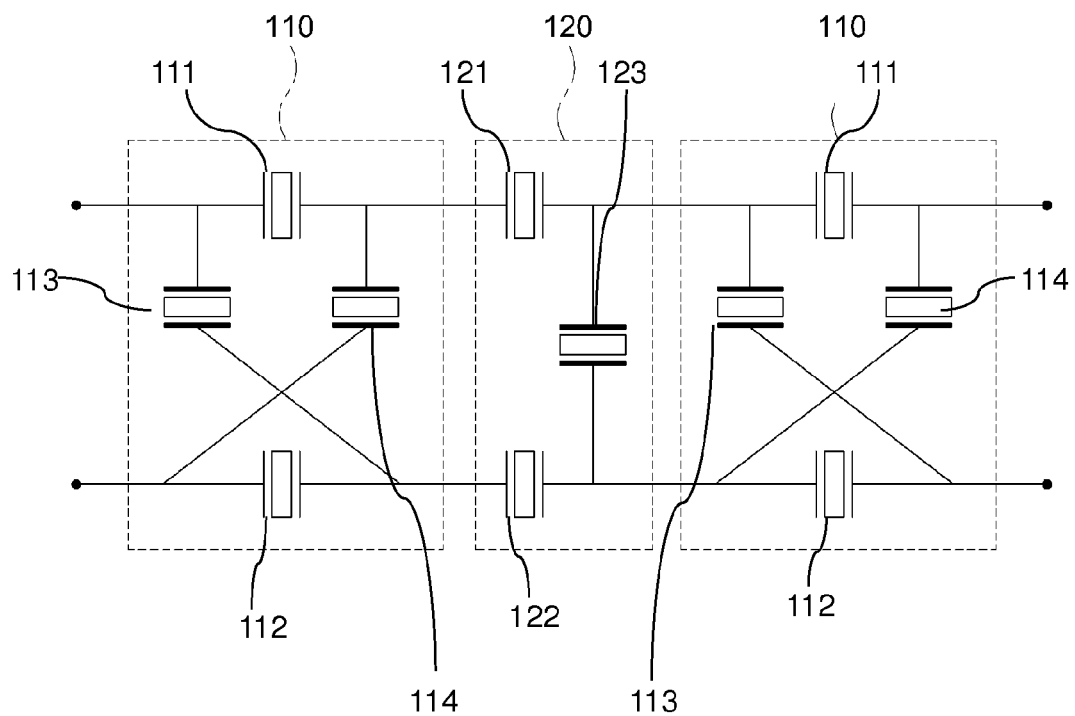
FIG. 6 is a diagram illustrating another example of a filtering apparatus.

FIG. 6 illustrates a configuration of another example of a filtering apparatus. In this example, the filtering apparatus includes two bridges 110 and a first ladder 120. Here, the two bridges 110 and the first ladder 120 are configured to enable a signal to be inputted in an order from a bridge 110, a ladder 120, to the other bridge 110. In this instance, input ends of two BAWRs 111, 112 included in one of the bridges 110 are an input end for dual input, and output ends of two BAWRs 111, 112 included in the other bridge 110 are an output end for dual output. The two BAWRs included in each of the two bridges 110 may be connected in series.

Although the configuration of the examples of the filtering apparatuses above have been described using only the first ladder 120 in FIGS. 5 and 6, the second ladder 220 may be used instead of the first ladder 120.

Figure 7:
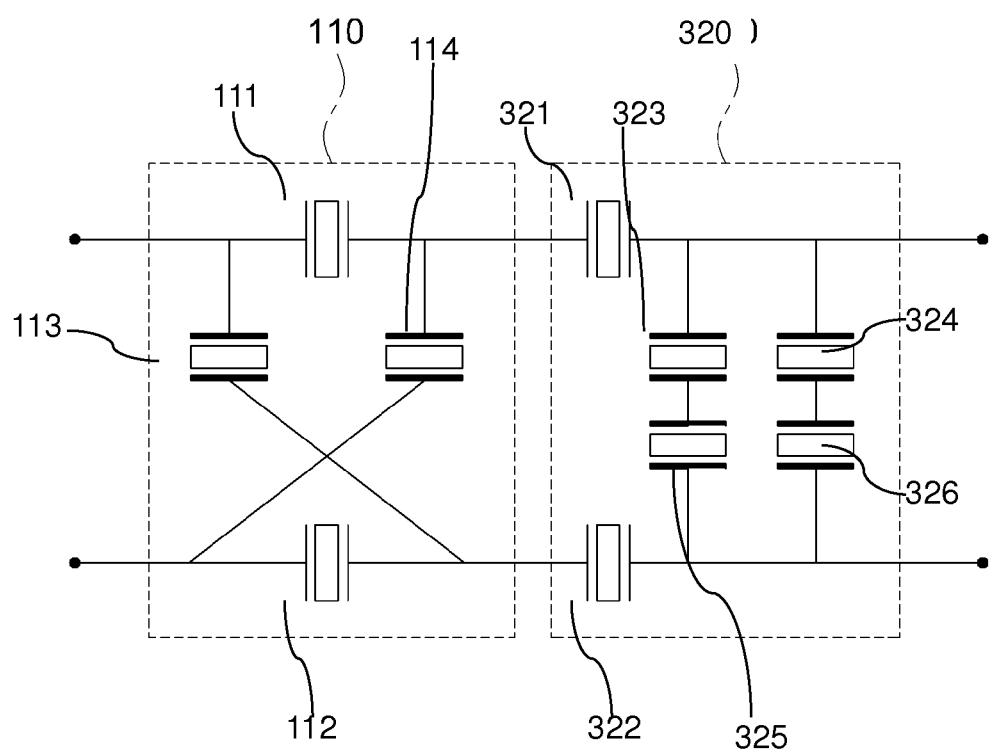
FIG. 7 is a diagram illustrating another example of a filtering apparatus.

FIG. 7 illustrates a configuration of another example of a filtering apparatus. The filtering apparatus includes the bridge 110 and a third ladder 320. The third ladder 320 further includes an eighth BAWR 321, a ninth BAWR 322, and a plurality of additional BAWRs 323, 324, 325, and 326. The eighth BAWR 321 and the ninth BAWR 322 are connected in series. A group of the plurality of BAWRs 323 and 325 may be connected in parallel to another group of the plurality of additional BAWRs 324 and 326. In this example, the plurality of additional BAWRs 323-326 is connected in parallel divided into two rows. An end of each adjacent BAWR connected in parallel may be connected to each other. Another end of a first-located BAWR (for example, 323 or 324) of each of the two rows may be connected to an output end of an eighth BAWR 321, and another end of a last-located BAWR (for example 325 or 326) of each of the two rows may be connected to an output of a ninth BAWR 322. Although it is illustrated in the example of FIG. 7 that the bridge 110 and the third ladder 320 are configured to enable a signal to be inputted in an order from a bridge to a ladder, the configuration may vary to enable a signal to be inputted in an order from a ladder to a bridge. Additionally, the example of FIG. 7 shows the plurality of additional BAWRs 323-326 to include four BAWRs. However, this is shown only for the purposes of example, and any other suitable number of BAWRs may be included in the plurality of additional BAWRs.

Figure 8:
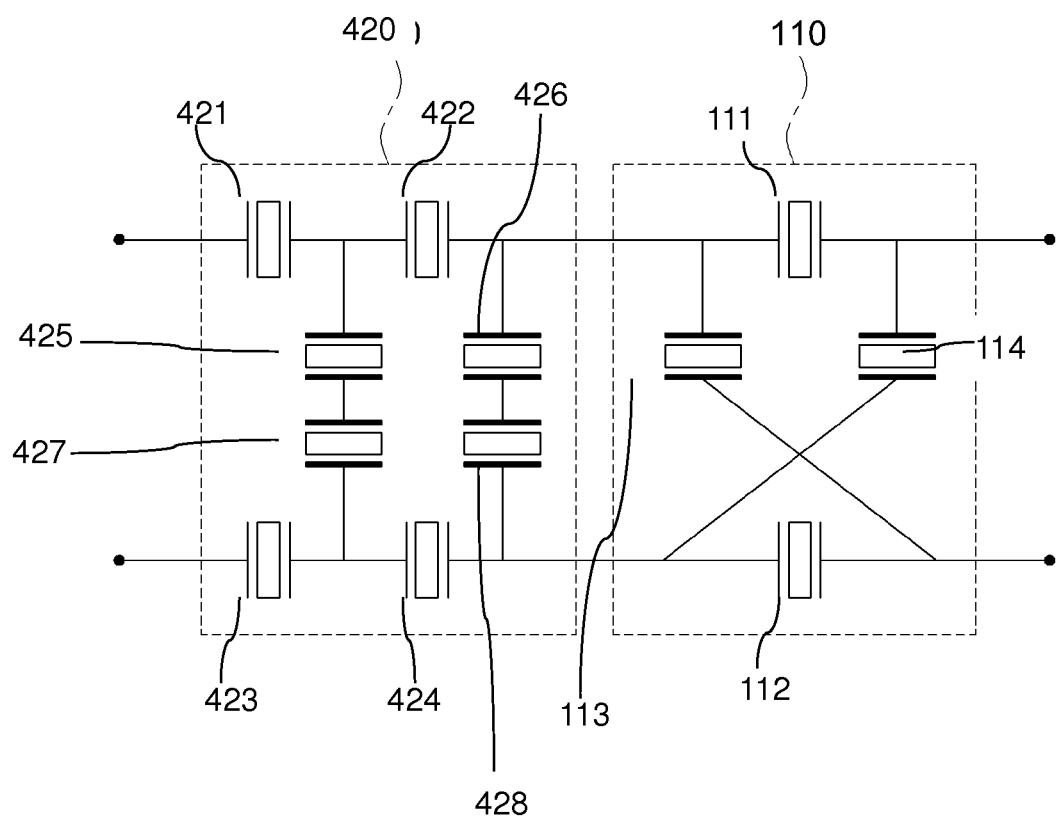
FIG. 8 is a diagram illustrating another example of a filtering apparatus.

FIG. 8 illustrates a configuration of another example of a filtering apparatus. In this example, the filtering apparatus includes a bridge 110 and a fourth ladder 420. The fourth ladder 420 includes a tenth BAWR 421, an eleventh BAWR 422, a twelfth BAWR 423 and a thirteenth BAWR 424. Also, the fourth ladder 420 further includes a plurality of additional BAWRs 425, 426, 427, and 428. A group of the plurality of additional BAWRs 425 and 427 may be connected in parallel to another group of the plurality of additional BAWRs 6 and 428. The tenth BAWR 421 and the eleventh BAWR 422 are connected in series, and an end of each of the tenth BAWR 421 and the eleventh BAWR 422 are connected to each other. The twelfth BAWR 423 and the thirteenth BAWR 424 are connected in series, and an end of each of the twelfth BAWR 423 and the thirteenth BAWR 424 are connected to each other. In this instance, the plurality of additional BAWRs 425-428 connected in parallel is divided into two rows, and an end of each adjacent BAWR connected in parallel may be connected. Another end of a first-located BAWR (for example, 425 or 426) of each of the two rows is connected to an output end of each of the tenth BAWR 421 and the eleventh BAWR 422, and another end of a last-located BAWR (for example, 427 or 428) of each of the two rows is connected to an output of each of the twelfth BAWR 423 and the thirteenth BAWR 424. Although it is illustrated in the example shown in FIG. 8 that the bridge 110 and the fourth ladder 420 are configured to enable a signal to be inputted in an order from a ladder to a bridge, the configuration may vary to enable a signal to be inputted in an order from a bridge to a ladder. Additionally, the example of FIG. 8 shows the plurality of additional BAWRs 425-428 to include four BAWRs. However, this is shown only for the purposes of example, and any other suitable number of BAWRs may be included in the plurality of additional BAWRs.

Figure 9:
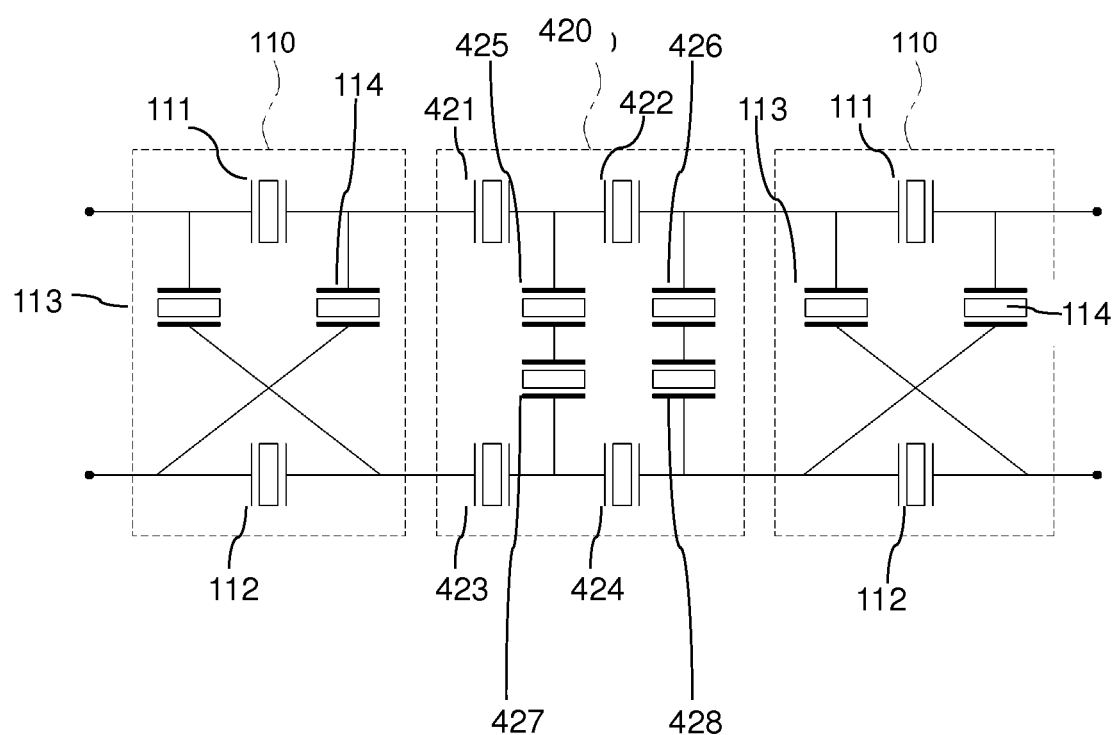
FIG. 9 is a diagram illustrating another example of a filtering apparatus.

FIG. 9 illustrates a configuration of another example of a filtering apparatus. The filtering apparatus includes two bridges 110 and the fourth ladder 420. Each bridge 110 and the fourth ladder 420 may include a configuration of BAWRs as described above. The two bridges 110 and the fourth ladder 420 are configured to enable a signal to be inputted in an order from a bridge 110, a ladder 420, to the other bridge 110. Alternatively, a third ladder 320 (not shown herein) may be used instead of the fourth ladder 420.

Figure 10:
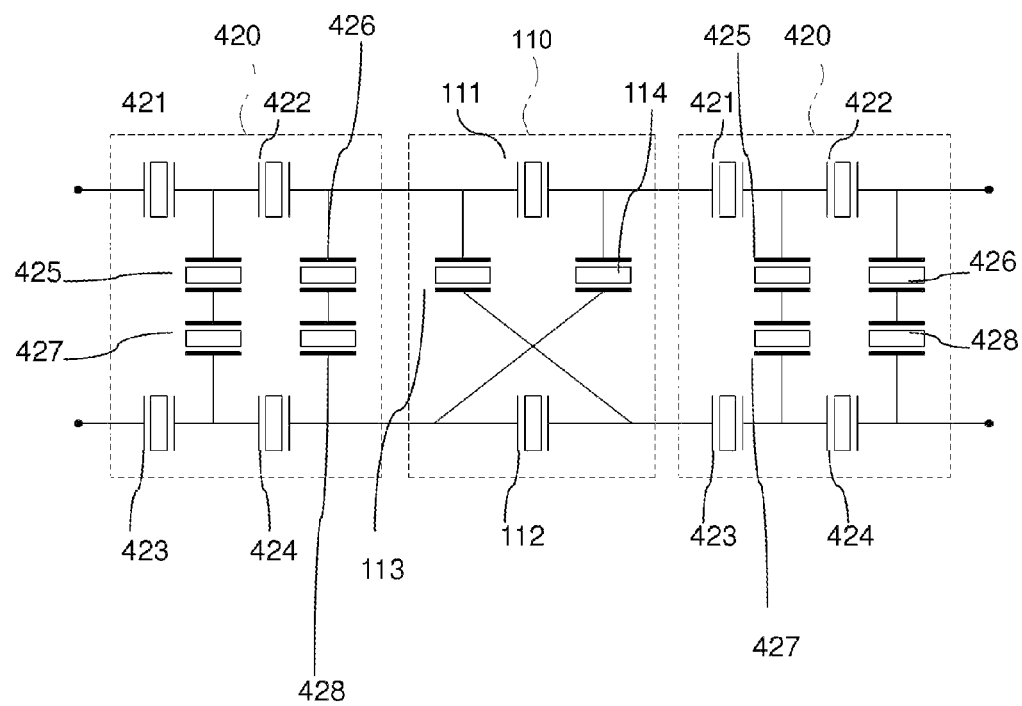
FIG. 10 is a diagram illustrating another example of a filtering apparatus.

FIG. 10 illustrates a configuration of another example of a filtering apparatus. The filtering apparatus includes a bridge 110 and two fourth ladders 420. The bridge 110 and the two fourth ladders 420 are configured to enable a signal to be inputted in an order from a ladder 420, a bridge 110, to the other ladder 420. Alternatively, third ladders 320 (not shown herein) may be used instead of the fourth ladders 420.

Accordingly, a Dual Input, Dual Output filtering apparatus may be arranged in a back end of an analog RF region, and thus a number of components may be reduced, and a circuit which is robust against loss and noise may be provided. Also, a size and a cost of a circuit may be reduced, and a performance of the circuit may be improved. Additionally, through the examples described above, the filtering apparatus may adjust an impedance characteristic without a separate circuit component.

Figure 11:
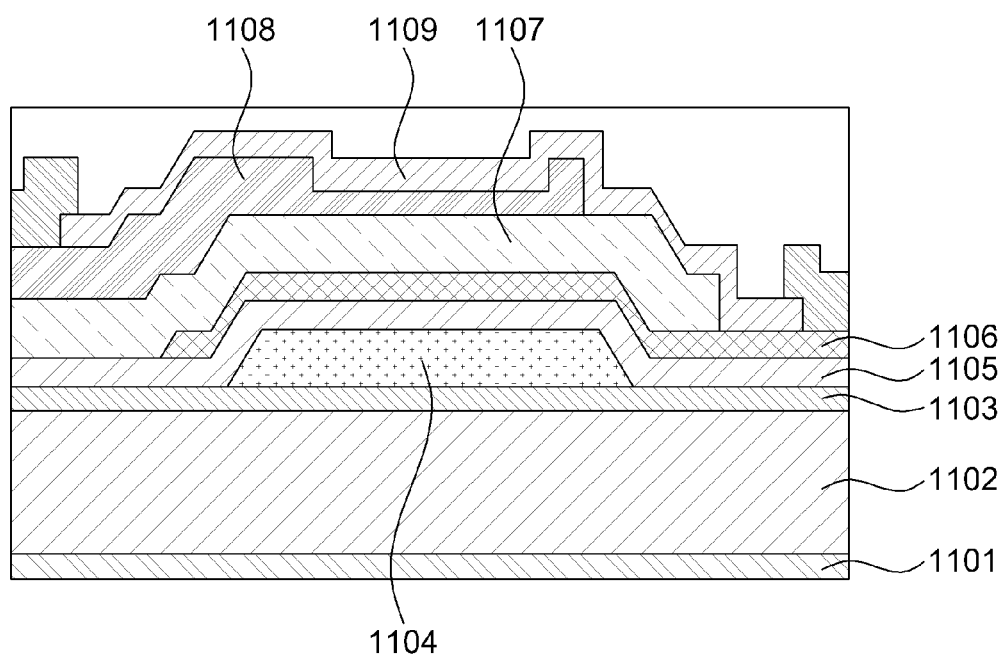
FIG. 11 is a cross-sectional diagram illustrating an example of a structure of a resonator.

FIG. 11 illustrates an example of a structure of a resonator. The resonator corresponds to each of the plurality of BAWRs described in FIGS. 1 through 10. The resonator includes an air gap 1104, a support 1105, a second metal electrode 1106, a piezoelectric material 1107, a third metal electrode 1108, and a dielectric substance 1109. The air gap 1104 may be formed on a Low Temperature Oxide (LTO) 1103 located on silicon 1102 or formed on silicon 1102 located on a first metal electrode 1101. The support 1105 may be formed on the air gap 1104 using a dielectric substance. The second metal electrode 1106 may be formed on the support 1105. The piezoelectric material 1107 may be formed on the second metal electrode 1106. The third metal electrode 1108 may be formed on the piezoelectric material 1107. The dielectric substance 1109 may be formed on the third metal electrode 1108.

In this example, the support 1105 may be formed using any one of the LTO 1103 and Silicon Nitride as the dielectric substance. The second metal electrode 1106 may be formed using Molybdenum (Mo). The piezoelectric material 1107 may be formed using Aluminum Nitride (AlN). The third metal electrode 1108 may be formed using ruthenium (Ru). Also, the dielectric substance 1109 formed on the third metal electrode 1108 may be formed using the LTO 1103. However, support 1105, second metal electrode 1106, piezoelectric material 1107, third metal electrode 1108 and dielectric substance 1109 may be formed of other suitable materials, respectively.

Accordingly, a Dual Input, Dual Output filtering apparatus may be arranged in a back end of an analog RF region, and thus a number of components may be reduced, and a circuit which is robust against loss and noise may be provided. Also, a size and a cost of a circuit may be reduced, and a performance of the circuit may be improved.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A filtering apparatus, comprising:
an input end configured for Dual Input;
a first ladder comprising a first plurality of BAWRs (Bulk Acoustic Wave Resonators), the first ladder being connected to the input end;
a bride comprising a second plurality of BAWRs, the bride being connected to the first ladder;
a second ladder comprising a third plurality of BAWRs, the second ladder being connected to the bridge; and
an output end configured for Dual Output, the output end being connected to the second ladder,
wherein the first plurality of BAWRs of the first ladder comprise:
a first BAWR being connected to a first input of the input end;
a second BAWR being connected to a second input of the input end; and
a third BAWR being connected between an input of the first BAWR and an input of the second BAWR,
wherein the second it of BAWRs of the bridge comprise:
a fourth BAWR being connected to an output of the first BAWR of the first ladder;
a fifth BAWR being connected to an output of the second BAWR of the first ladder;
a sixth BAWR being connected between an input of the fourth BAWR and an output of the fifth BAWR; and
a seventh BAWR being connected between an output of the fourth BAWR and an input of the fifth BAWR,
and wherein the third plurality of BAWRs of the second ladder comprise:
an eighth BAWR being connected to the output of the fourth BAWR of the bridge;
a ninth BAWR being connected to the output of the fifth BAWR of the bridge; and
a tenth BAWR being connected between an input of the eighth BAWR and an input of the ninth BAWR.

2. The filtering apparatus of claim 1, wherein the first BAWR, the second BAWR, the fourth BAWR, the fifth BAWR, the eight BAWR, and the ninth BAWR have different resonant frequencies than the third BAWR, the sixth BAWR, the seventh BAWR, and the tenth BAWR.

3. A filtering apparatus, comprising:
an input end configured for Dual Input;
a first ladder comprising a first plurality of BAWRs (Bulk Acoustic Wave Resonators), the ladder being connected to the input end;
a bridge comprising a second plurality of BAWRs, the bridge being connected to the first ladder;
a second ladder comprising a third plurality of BAWRs, the second ladder being connected to the bridge; and
an output end configured or Dual Output, the output end being connected to the second ladder,
wherein the first plurality of BAWRs of the first ladder comprise:
a first BAWR being connected to a first input of the input end;
a second BAWR being connected to a second input of the input end; and
a third BAWR being connected between an output of the first BAWR and an output of the second BAWR,
wherein the second plurality of BAWRs of the bridge comprise;
a fourth BAWR being connected to the output of the first BAWR of the first ladder;
a fifth BAWR being connected to the output of the second BAWR of the first ladder;
a sixth BAWR being connected between an input of the fourth BAWR and an output of the fifth BAWR; and
a seventh BAWR being connected between an output of the fourth BAWR and an input of the fifth BAWR,
and wherein the third plurality of BAWRs of the second ladder comprise:
an eighth BAWR being connected to the output of the fourth BAWR of the bridge;
a ninth BAWR being connected to the output of the fifth BAWR of the bridge; and
a tenth BAWR being connected between an input of the eighth BAWR and an input of the ninth BAWR.

4. The filter apparatus of claim 3, wherein the first BAWR, the second BAWR, the fourth BAWR, the fifth BAWR, the eight BAWR, and the ninth BAWR have different resonant frequencies than the third BAWR, the sixth BAWR, the seventh BAWR, and the tenth BAWR.

5. A filtering apparatus, comprising:
an input end configured for Dual Input;
a first ladder comprising a first plurality of BAWRs (Bulk Acoustic Wave Resonators), the first ladder being connected to the input end;
a bridge comprising a second plurality of BAWRs, the bridge being connected to the first ladder;
a second ladder comprising a third plurality of BAWRs, the second ladder being connected to the bridge; and
an output end configured for Dual Output, the output end being connected to the second ladder, wherein the first plurality of BAWRs of the first ladder comprise:
a first BAWR being connected to a first input of the input end;
a second BAWR being connected to a second input of the input end; and
a third BAWR being connected between an input of the first BAWR and an input of the second BAWR,
wherein the second plurality of BAWRs of the bridge comprise:
a fourth BAWR being connected to an output of the first BAWR of the first ladder;
a fifth BAWR being connected to an output of the second BAWR of the first ladder;
a sixth BAWR being connected between an input of the fourth BAWR and an output of the fifth BAWR; and
a seventh BAWR being connected between an output of the fourth BAWR and an input of the fifth BAWR,
and wherein the third plurality of BAWRs of the second ladder comprise:
an eighth BAWR being connected to the output of the fourth BAWR of the bridge;
a ninth BAWR being connected to the output of the fifth BAWR of the bridge; and
a tenth BAWR being connected between an output of the eighth BAWR and an output of the ninth BAWR.

6. The filtering apparatus of claim 5, wherein the first BAWR, the second BAWR, the fourth BAWR, the fifth BAWR, the eight BAWR, and the ninth BAWR have different resonant frequencies than the third BAWR, the sixth BAWR, the seventh BAWR, and the tenth BAWR.

7. A filtering apparatus, comprising:
an input end configured for Dual Input;
a first ladder comprising a first plurality of BAWRs (Bulk Acoustic Wave Resonators), the first ladder being connected to the input end;
a bridge comprising a second plurality of BAWRs, the bridge being connected to the first ladder;
a second ladder comprising a third plurality of BAWRs, the second ladder being connected to the bridge; and
an output end configured for Dual Output, the output end being connected to the second ladder,
wherein the first plurality of BAWRs of the first ladder comprise:
a first BAWR being connected to a first input of the input end;
a second BAWR being connected to a second input of the input end; and
a third BAWR being connected between an output of the first BAWR and an output of the second BAWR,
wherein the second plurality of BAWRs of the bridge comprise:
a fourth BAWR being connected to the output of the first BAWR of the first ladder;
a fifth BAWR being connected to the output of the second BAWR of the first ladder;
a sixth BAWR being connected between an input of the fourth BAWR and an output of the fifth BAWR; and
a seventh BAWR being connected between an output of the fourth BAWR and an input of the fifth BAWR,
and wherein the third plurality of BAWRs of the second ladder comprise:
an eighth BAWR being connected to the output of the fourth BAWR of the bridge;
a ninth BAWR being connected to the output of the fifth BAWR of the bridge; and
a tenth BAWR being connected between an output of the eighth BAWR and an output of the ninth BAWR.

8. The filtering apparatus of claim 7, wherein the first BAWR, the second BAWR, the fourth BAWR, the fifth BAWR, the eight BAWR, and the ninth BAWR have different resonant frequencies than the third BAWR, the sixth BAWR, the seventh BAWR, and the tenth BAWR.

* * * * *